(12) United States Patent
Saitoh et al.

(10) Patent No.: US 11,985,876 B2
(45) Date of Patent: May 14, 2024

(54) DISPLAY DEVICE

(71) Applicant: SHARP KABUSHIKI KAISHA, Sakai (JP)

(72) Inventors: Takao Saitoh, Sakai (JP); Masahiko Miwa, Sakai (JP); Yohsuke Kanzaki, Sakai (JP); Yi Sun, Sakai (JP); Masaki Yamanaka, Sakai (JP); Seiji Kaneko, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 729 days.

(21) Appl. No.: 17/261,261

(22) PCT Filed: Jul. 20, 2018

(86) PCT No.: PCT/JP2018/027255
§ 371 (c)(1),
(2) Date: Jan. 19, 2021

(87) PCT Pub. No.: WO2020/017014
PCT Pub. Date: Jan. 23, 2020

(65) Prior Publication Data
US 2021/0296426 A1 Sep. 23, 2021

(51) Int. Cl.
*H10K 59/131* (2023.01)
*H10K 77/10* (2023.01)
*H01L 29/786* (2006.01)
*H10K 102/00* (2023.01)

(52) U.S. Cl.
CPC ....... *H10K 59/1315* (2023.02); *H10K 77/111* (2023.02); *H01L 29/78603* (2013.01); *H01L 29/78633* (2013.01); *H10K 2102/311* (2023.02)

(58) Field of Classification Search
CPC ............. H10K 59/1315; H10K 77/111; H10K 2102/311; H10K 59/131; H10K 59/124; Y02E 10/549; G09F 9/00; G09F 9/30; H01L 29/78633; H01L 29/78603
See application file for complete search history.

(56) References Cited

U.S. PATENT DOCUMENTS

| | | | |
|---|---|---|---|
| 2012/0229408 A1* | 9/2012 | Yamamoto | G06F 3/04166 345/173 |
| 2014/0353670 A1 | 12/2014 | Youn et al. | |
| 2015/0287750 A1 | 10/2015 | Youn et al. | |
| 2017/0170206 A1* | 6/2017 | Lee | H01L 27/1218 |
| 2018/0053905 A1* | 2/2018 | Lee | H10K 59/126 |

FOREIGN PATENT DOCUMENTS

JP 2014-232300 A 12/2014

* cited by examiner

Primary Examiner — Patricia D Valenzuela
(74) Attorney, Agent, or Firm — ScienBiziP, P.C.

(57) ABSTRACT

First overlying wires are provided between a display area and a bending portion, extending parallel to each other in a direction crossing the direction in which the bending portion extends. Underlying wires are provided between a first resin layer and a second resin layer on a resin substrate, extending across a slit and parallel to each other in a direction crossing the direction in which the bending portion extends. The first overlying wires are electrically connected respectively to the underlying wires via first contact holes formed through the second resin layer and inorganic insulation films.

15 Claims, 8 Drawing Sheets

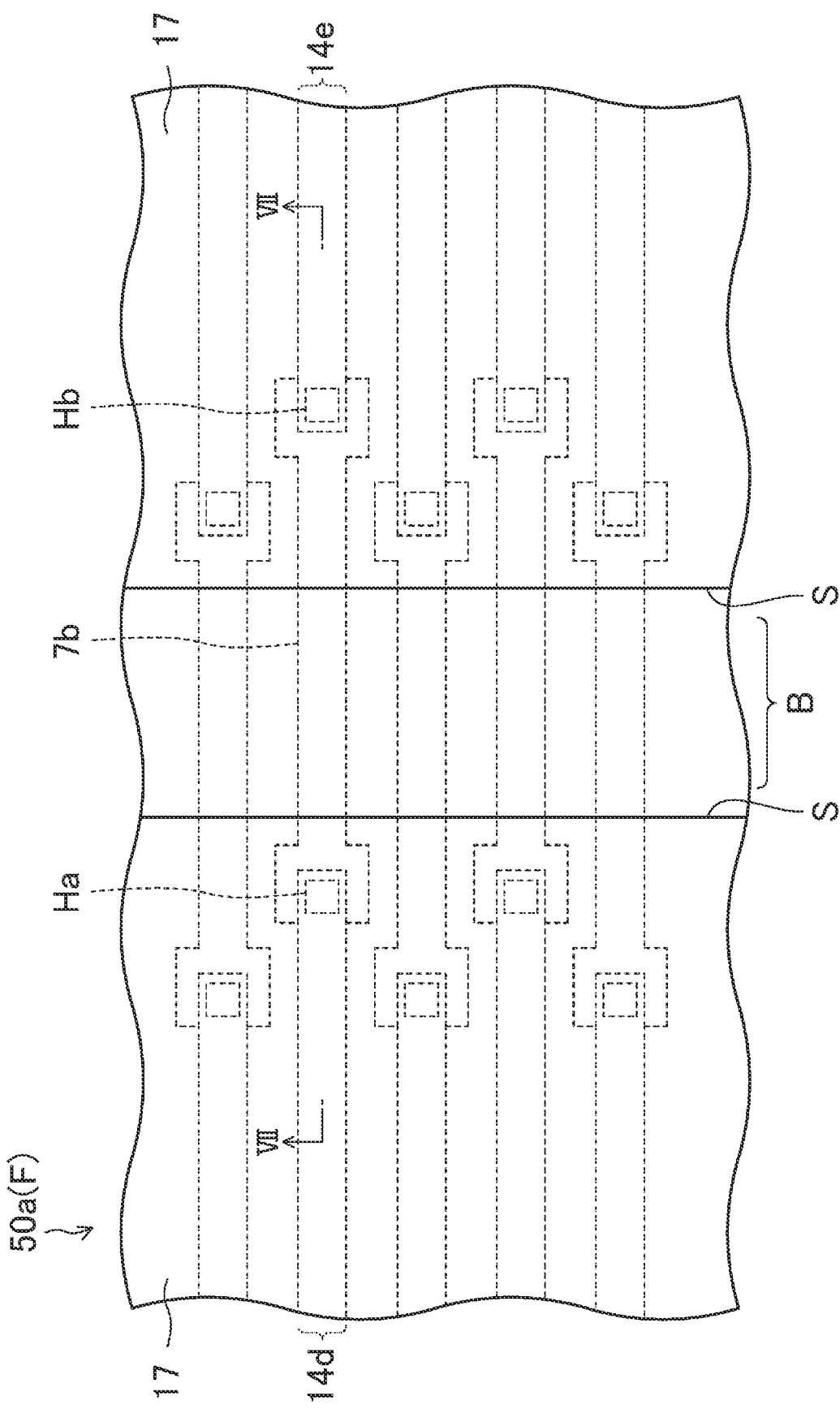

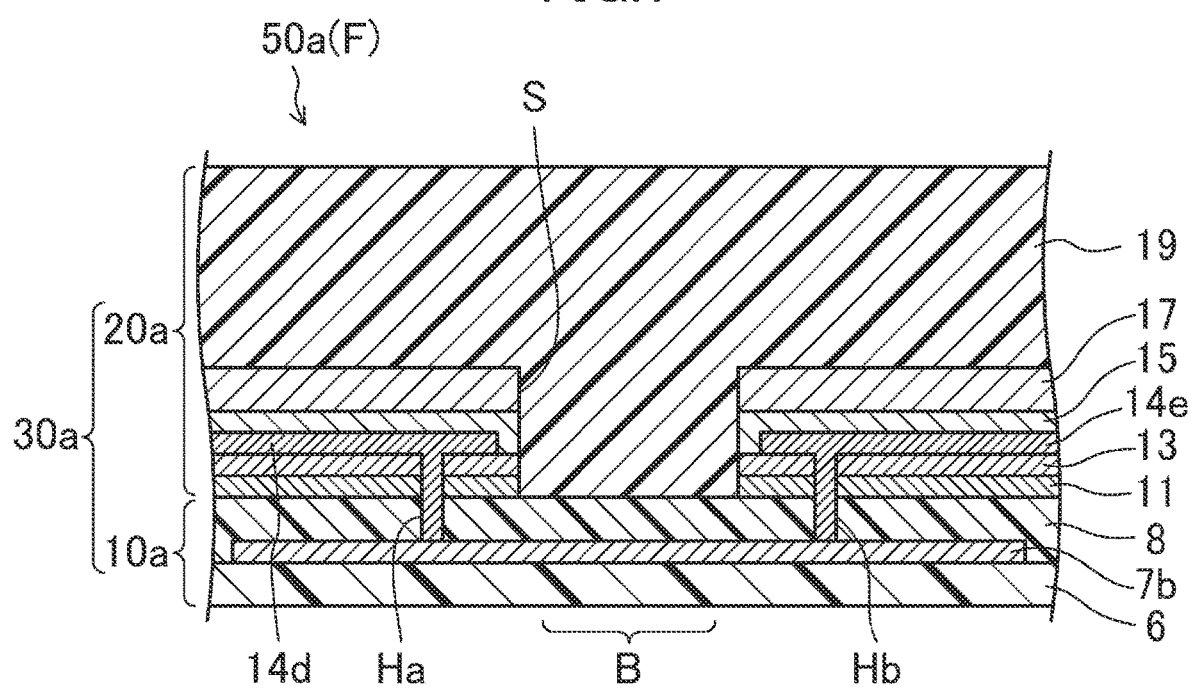
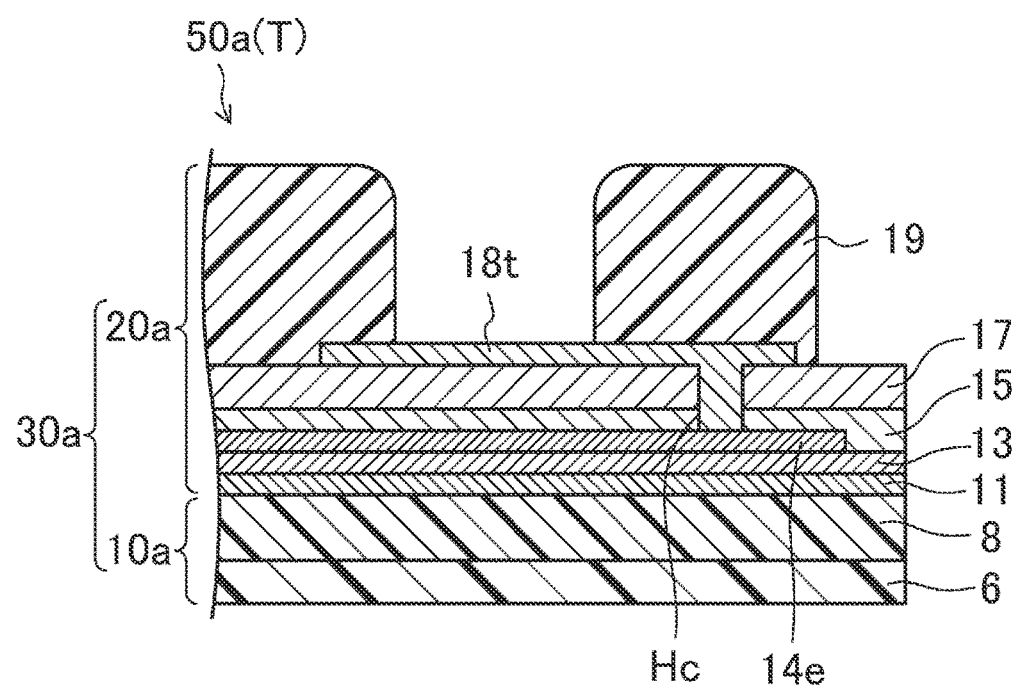

DISPLAY DEVICE

TECHNICAL FIELD

The disclosure relates to display devices.

BACKGROUND ART

The OLED display device, or the self-luminous display device built around OLEDs (organic light-emitting diodes), has been attracting attention as a promising successor to the liquid crystal display device. Some flexible OLED display devices are being proposed that include a flexible resin substrate carrying thereon OLEDs and other related components. The OLED display device has a display area for displaying images and a frame area surrounding the display area. There is a demand to reduce the frame area. If the frame area is bent for a reduced frame area in a plan view of the flexible OLED display device, the wiring in the frame area could break.

As an example, Patent Literature 1 discloses a flexible display device including bending holes. A buffer film, a gate insulation film, and an interlayer insulation film are removed in a location corresponding to the bending region to prevent breaks in the wiring.

CITATION LIST

Patent Literature

Patent Literature 1: Japanese Unexamined Patent Application Publication, Tokukai, No. 2014-232300

SUMMARY

Technical Problem

The flexible OLED display device includes inorganic insulation films such as a base coat film, a gate insulation film, and an interlayer insulation film on a resin substrate. Breaks in wiring may be prevented in the frame area by removing the inorganic insulation films in a bending portion of the frame area, substituting a planarization film where the inorganic insulation has been removed, and then forming wiring on the planarization film. The OLED display device structured in this manner, however, requires separate formation of a planarization film only where the inorganic insulation films have been removed from the bending portion of the frame area. The OLED display device has room for improvement.

In view of these issues, it is an object of the disclosure to reduce breaks in wiring without having to separately provide a planarization film in a bending portion of the frame area.

Solution to Problem

To achieve the object, the disclosure is directed to a display device including: a resin substrate on which a display area where an image is displayed and a frame area surrounding the display area are specified; a TFT layer on the resin substrate; a terminal section along a side of the frame area; a bending portion extending in one direction between the display area and the terminal section; a stack of inorganic insulation films on the resin substrate, the inorganic insulation films partially constituting the TFT layer and having a slit formed therethrough in the bending portion to expose a top face of the resin substrate; and a plurality of first overlying wires on any one of the inorganic insulation films, the first overlying wires partially constituting the TFT layer and between the display area and the bending portion, extending parallel to each other in a direction crossing the direction in which the bending portion extends, wherein the resin substrate includes: a first resin layer in the display area and the frame area opposite the TFT layer; a plurality of underlying wires on a TFT layer side of the first resin layer in the frame area, the underlying wires extending across the slit and parallel to each other in a direction crossing the direction in which the bending portion extends; and a second resin layer on the TFT layer side of the first resin layer in the display area and the frame area, the second resin layer covering the underlying wires, and the first overlying wires are electrically connected respectively to the underlying wires via a plurality of first contact holes formed through the second resin layer and the inorganic insulation films residing between the first overlying wires and the underlying wires.

Advantageous Effects of Disclosure

In the disclosure, the first overlying wires residing between the display area and the bending portion are electrically connected respectively to the underlying wires residing between the first resin layer and the second resin layer on the resin substrate. This structure can reduce breaks in wiring without having to separately provide a planarization film in a bending portion of the frame area.

BRIEF DESCRIPTION OF DRAWINGS

FIG. 6 is a plan view of a bending portion in a frame area of the OLED display device in accordance with the first embodiment of the disclosure.

FIG. 7 is a cross-sectional view, taken along line VII-VII shown in FIG. 6, of the bending portion in the frame area of the OLED display device.

FIG. 8 is a cross-sectional view of a terminal section in the frame area of the OLED display device in accordance with the first embodiment of the disclosure.

DESCRIPTION OF EMBODIMENTS

The following will describe embodiments of the disclosure in detail with reference to drawings. The disclosure is by no means limited to these embodiments.

First Embodiment

Figure 1:
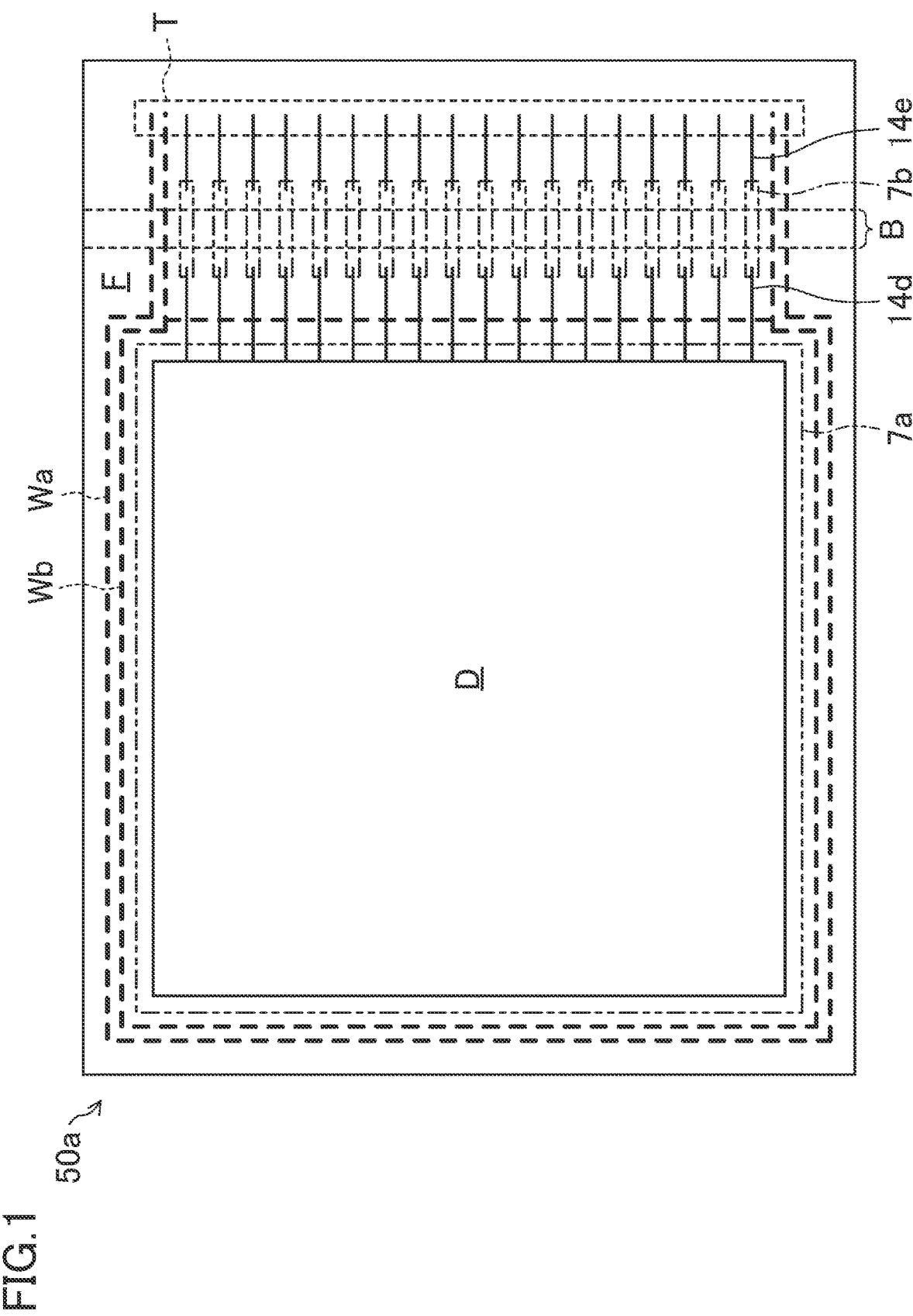
FIG. 1 is a schematic plan view of a structure of an OLED display device in accordance with a first embodiment of the disclosure.
Figure 2:
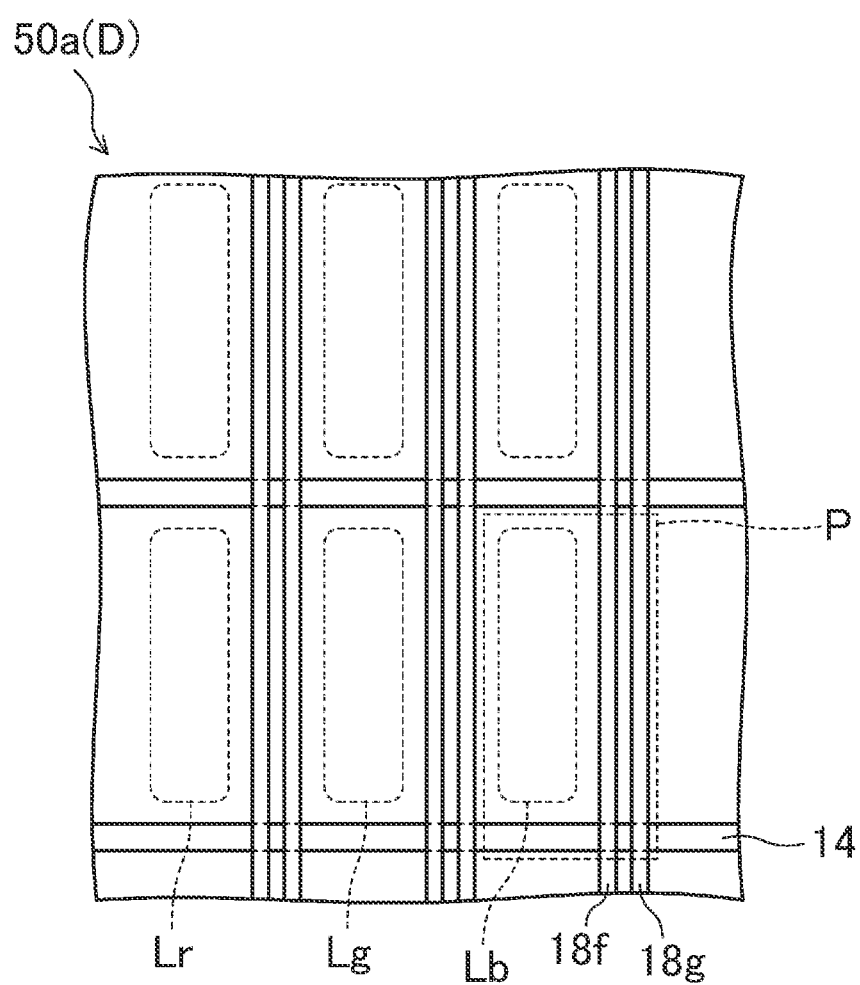
FIG. 2 is a plan view of a display area of the OLED display device in accordance with the first embodiment of the disclosure.
Figure 3:
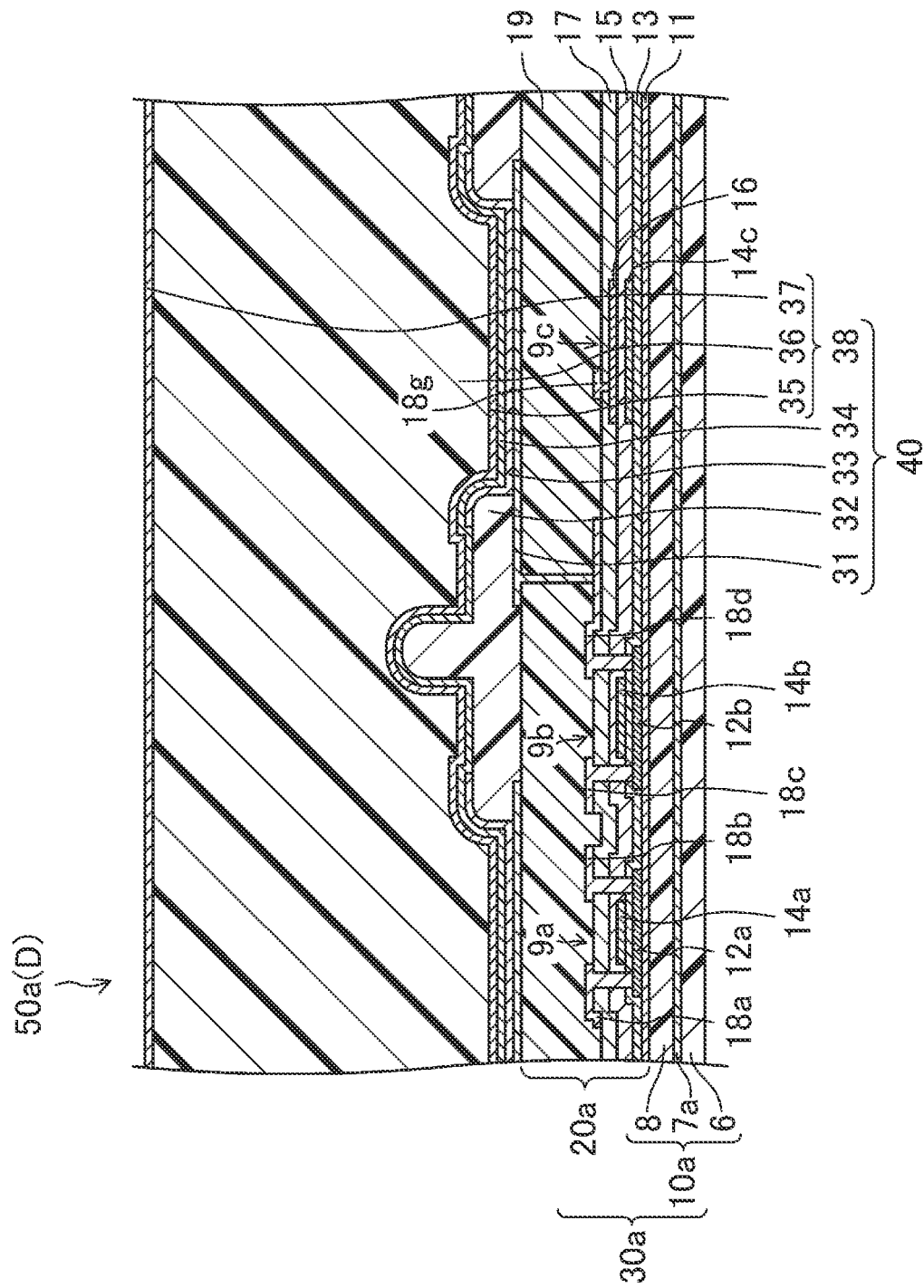
FIG. 3 is a cross-sectional view of the display area of the OLED display device in accordance with the first embodiment of the disclosure.
Figure 4:
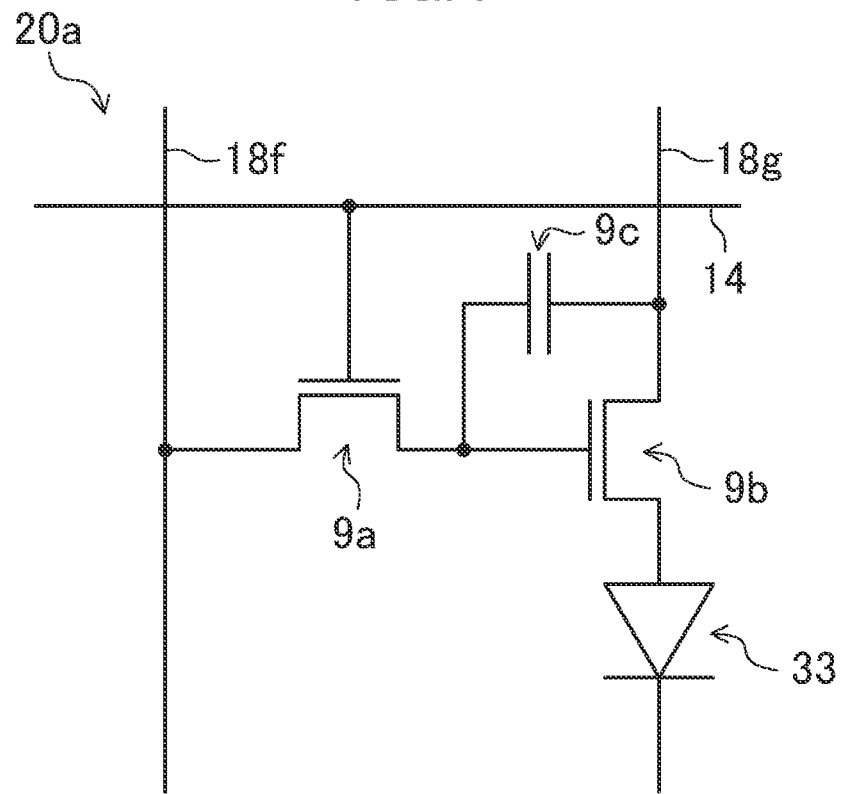
FIG. 4 is an equivalent circuit diagram of a TFT layer in the OLED display device in accordance with the first embodiment of the disclosure.
Figure 5:
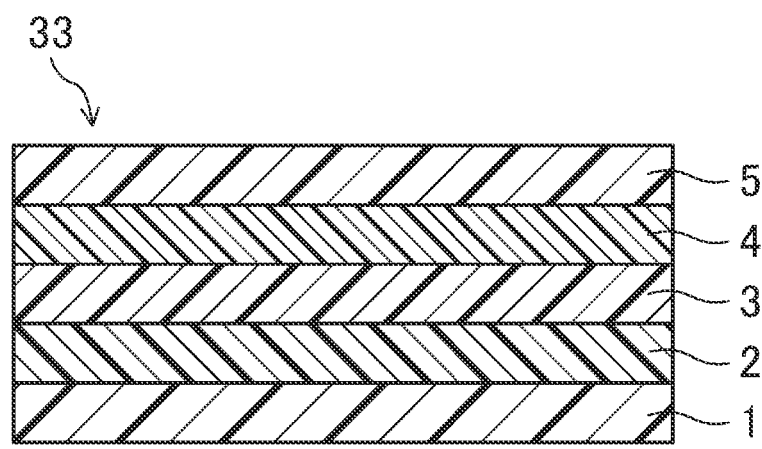
FIG. 5 is a cross-sectional view of an organic light-emitting layer in the OLED display device in accordance with the first embodiment of the disclosure.

FIGS. 1 to 9 depict a first embodiment of a display device in accordance with the disclosure. Each embodiment below will discuss an OLED display device including OLEDs as an example of a display device including light-emitting elements. FIG. 1 is a schematic plan view of a structure of an OLED display device 50a in accordance with the present embodiment. FIG. 2 is a plan view of a display area D of the OLED display device 50a. FIG. 3 is a cross-sectional view of the display area D of the OLED display device 50a. FIG. 4 is an equivalent circuit diagram of a TFT layer 20a in the OLED display device 50a. FIG. 5 is a cross-sectional view of one of organic light-emitting layers 33 in the OLED display device 50a. FIG. 6 is a plan view of a bending portion B in a frame area F of the OLED display device 50a. FIG. 7 is a cross-sectional view, taken along line VII-VII shown in FIG. 6, of the bending portion B in the frame area F of the OLED display device 50a. FIG. 8 is a cross-sectional view of a terminal section T in the frame area F of the OLED display device 50a.

The OLED display device 50a has, for example, the rectangular display area D for displaying images and the frame area F surrounding the display area D, as shown in FIG. 1.

There is provided a matrix of subpixels P in the display area D as shown in FIG. 2. In the display area D, for example, a subpixel P including a red-light-emitting region Lr for a display in red, a subpixel P including a green-light-emitting region Lg for a display in green, and a subpixel P including a blue-light-emitting region Lb for a display in blue are provided adjacent to each other again as shown in FIG. 2. Each pixel in the display area D is formed by, for example, three adjacent subpixels P including the red-light-emitting region Lr, the green-light-emitting region Lg, and the blue-light-emitting region Lb respectively.

As shown in FIG. 1, the frame area F has the terminal section T on the far right of FIG. 1. The frame area F also has the bending portion B extending in one direction (vertical direction in FIG. 1) between the display area D and the terminal section T as shown in FIG. 1. The bending portion B can be bent 180° along a vertical line in FIG. 1 (to form a U-shape).

The OLED display device 50a, as shown in FIG. 3, includes: an active matrix substrate 30a; and OLEDs 40 as light-emitting elements on the active matrix substrate 30a.

The active matrix substrate 30a, as shown in FIG. 3, includes: a resin substrate layer 10a as a resin substrate; and the TFTs (thin film transistor) layer 20a on the resin substrate layer 10a.

The resin substrate layer 10a, as shown in FIGS. 3 and 7, includes: a first resin layer 6 in the display area D and the frame area F opposite the TFT layer 20a; a second resin layer 8 on the TFT layer 20a side of the first resin layer 6 in the display area D and the frame area F; and an underlying conductive layer 7a and a plurality of underlying wires 7b between the first resin layer 6 and the second resin layer 8.

The first resin layer 6 and the second resin layer 8 are made of, for example, a polyimide resin. The surface on the second resin layer 8 side of the first resin layer 6 is made rough by, for example, ashing by plasma to have irregularities with an arithmetic average Ra of the roughness of approximately 1 nm to 30 nm for the improvement of adherence of the underlying conductive layer 7a to the underlying wires 7b. The second resin layer 8 is provided on the first resin layer 6 to cover the underlying conductive layer 7a and the underlying wires 7b, as shown in FIGS. 3 and 7.

The underlying conductive layer 7a is provided to overlap the entire display area D as shown in FIG. 1 and structured to restrain degradation of the organic light-emitting layer 33 (detailed later) in the OLED 40, by blocking the movement of water from the first resin layer 6 to the second resin layer 8. The underlying conductive layer 7a is electrically connected to a low-voltage supply line Wa or a high-voltage supply line Wb in the frame area F (see FIG. 1), to lower the electrical resistance of the voltage supply line. The low-voltage supply line Wa is electrically connected to a second electrode 34 of the OLED 40 (described later). The low-voltage supply line Wa is shaped generally like "C" surrounding the display area D as shown in FIG. 1 with both ends thereof reaching the terminal section T to receive incoming low power supply voltage. The high-voltage supply line Wb is electrically connected to a first electrode 31 of the OLED 40 (described later) via second TFTs 9b (described later). The high-voltage supply line Wb is provided like a frame around the display area D as shown in FIG. 1 and structured such that both ends of a side residing along the terminal section T can reach the terminal section T to receive incoming high power supply voltage. The low-voltage supply line Wa and the high-voltage supply line Wb are made of the same material and in the same layer as source lines 18f.

As shown in FIGS. 1, 6, and 7, the underlying wires 7b, on the TFT layer 20a side of the first resin layer 6 in the frame area F, run parallel to each other in a direction perpendicular to the direction in which the bending portion B is extended (the lateral direction in FIGS. 1 and 6) and transverse a slit S (detailed later). The underlying conductive layer 7a and the underlying wires 7b are made of the same material (e.g., a film of molybdenum or a like metal) as gate lines 14 (detailed later). The underlying conductive layer 7a and the underlying wires 7b may be made of, for example, a monolayer film of titanium, tungsten, molybdenum, copper, or aluminum, a film of an alloy including any of these metals, or a stack of any of these films.

The TFT layer 20a, as shown in FIG. 3, includes: a base coat film 11 on the second resin layer 8 in the resin substrate layer 10a; a plurality of first TFTs 9a, the second TFTs 9b, a plurality of capacitors 9c on the base coat film 11; and a planarization film 19 on the first TFTs 9a, the second TFTs 9b, and the capacitors 9c. As shown in FIGS. 2 and 4, the TFT layer 20a includes, between a gate insulation film 13 and a first interlayer insulation film 15 (detailed later), the gate lines 14 extending parallel to each other in the lateral direction in FIGS. 2 and 4. As shown in FIGS. 2 and 4, the TFT layer 20a includes, between a second interlayer insulation film 17 and the planarization film 19 (detailed later), the source lines 18f extending parallel to each other in the vertical direction in FIGS. 2 and 4 perpendicular to the gate lines 14. As shown in FIGS. 2 and 4, the TFT layer 20a further includes a plurality of power supply lines 18g extending parallel to each other in the vertical direction in the FIGS. 2 and 4. The power supply lines 18g are provided adjacent to the respective source lines 18f as shown in FIG. 2. In the TFT layer 20a, each subpixel P includes a first TFT 9a, a second TFT 9b, and a capacitor 9c as shown in FIG. 4.

The base coat film 11 is made of, for example, a single inorganic insulation film of, for example, silicon nitride, silicon oxide, or silicon oxynitride or a stack of these films.

The first TFT 9a in each subpixel P is connected to the associated one of the gate lines 14 and the associated one of the source lines 18f, as shown in FIG. 4. The first TFT 9a includes a semiconductor layer 12a, the gate insulation film 13, a gate electrode 14a, the first interlayer insulation film 15, the second interlayer insulation film 17, a source electrode 18a, and a drain electrode 18b that are provided sequentially on the base coat film 11, as shown in FIG. 3. The semiconductor layer 12a is provided in an insular manner on the base coat film 11 as shown in FIG. 3 and has channel regions, source regions, and drain regions. The gate insulation film 13 is provided so as to cover the semiconductor layer 12a as shown in FIG. 3. The gate electrode 14a is provided on the gate insulation film 13 so as to overlap the channel region of the semiconductor layer 12a as shown in FIG. 3. The first interlayer insulation film 15 and the second interlayer insulation film 17 are provided sequentially so as to cover the gate electrode 14a as shown in FIG. 3. The source electrode 18a and the drain electrode 18b are provided on the second interlayer insulation film 17 at a distance from each other as shown in FIG. 3. The source electrode 18a and the drain electrode 18b are connected respectively to the source and drain regions of the semiconductor layer 12a via contact holes formed through the stack of the gate insulation film 13, the first interlayer insulation film 15, and the second interlayer insulation film 17, as shown in FIG. 3. The gate insulation film 13, the first interlayer insulation film 15, and the second interlayer insulation film 17 are made of a single inorganic insulation film of, for example, silicon nitride, silicon oxide, or silicon oxynitride or a stack of these films.

In each subpixel P, the second TFT 9b is connected to an associated one of the first TFTs 9a and an associated one of the power supply lines 18g as shown in FIG. 4. The second TFT 9b includes a semiconductor layer 12b, the gate insulation film 13, a gate electrode 14b, the first interlayer insulation film 15, the second interlayer insulation film 17, a source electrode 18c, and a drain electrode 18d that are provided sequentially on the base coat film 11, as shown in FIG. 3. The semiconductor layer 12b is provided in an insular manner on the base coat film 11 as shown in FIG. 3 and has channel regions, source regions, and drain regions. The gate insulation film 13 is provided so as to cover the semiconductor layer 12b as shown in FIG. 3. The gate electrode 14b is provided on the gate insulation film 13 so as to overlap the channel region of the semiconductor layer 12b as shown in FIG. 3. The first interlayer insulation film 15 and the second interlayer insulation film 17 are provided sequentially so as to cover the gate electrode 14b as shown in FIG. 3. The source electrode 18c and the drain electrode 18d are provided on the second interlayer insulation film 17 at a distance from each other as shown in FIG. 3. The source electrode 18c and the drain electrode 18d are connected respectively to the source and drain regions of the semiconductor layer 12b via contact holes formed through the stack of the gate insulation film 13, the first interlayer insulation film 15 and the second interlayer insulation film 17, as shown in FIG. 3.

The first TFTs 9a and the second TFTs 9b are top-gate TFTs in the present embodiment, but may alternatively be bottom-gate TFTs.

In each subpixel P, the capacitor 9c is connected to an associated one of the first TFTs 9a and an associated one of the power supply lines 18g as shown in FIG. 4. The capacitor 9c includes: a lower conductive layer 14c made of the same material and in the same layer as the gate line 14; the first interlayer insulation film 15 provided so as to cover the lower conductive layer 14c; and an upper conductive layer 16 provided on the first interlayer insulation film 15 so as to overlap the lower conductive layer 14c, as shown in FIG. 3. The upper conductive layer 16 is electrically connected to the power supply line 18g via a contact hole provided through the second interlayer insulation film 17 as shown in FIG. 3

There is provided the slit S through the stack of the base coat film 11, the gate insulation film 13, the first interlayer insulation film 15, and the second interlayer insulation film 17 in the TFT layer 20a in the bending portion B of the frame area F to expose the top face of the second resin layer 8 in the resin substrate layer 10a as shown in FIGS. 6 and 7. The slit S is formed like a groove in a direction in which the bending portion B is extended. The planarization film 19, provided across the plane shown in FIG. 6, is omitted in the plan view in FIG. 6. The slit S is formed through the stack of the base coat film 11, the gate insulation film 13, the first interlayer insulation film 15, and the second interlayer insulation film 17 in the present embodiment, but is not necessarily formed through the stack of the base coat film 11, the gate insulation film 13, the first interlayer insulation film 15, and the second interlayer insulation film 17. In other words, there may remain an inorganic insulation film on the bottom of the slit S.

There is provided a plurality of first overlying wires 14d between the gate insulation film 13 and the first interlayer insulation film 15 in the TFT layer 20a as shown in FIGS. 1, 6, and 7. The first overlying wires 14d, between the display area D and the bending portion B, run parallel to each other in a direction perpendicular to the direction in which the bending portion B is extended. The first overlying wires 14d are electrically connected respectively to the underlying wires 7b via first contact holes Ha formed through the stack of the second resin layer 8, the base coat film 11, and the gate insulation film 13, as shown in FIGS. 6 and 7. The plurality of first overlying wires 14d and a plurality of second overlying wires 14e (detailed later) are made of the same material and in the same layer as the gate lines 14.

The second overlying wires 14e are provided between the gate insulation film 13 and the first interlayer insulation film 15 in the TFT layer 20a as shown in FIGS. 1, 6, and 7. The second overlying wires 14c, between the bending portion B and the terminal section T, run parallel to each other in a direction perpendicular to the direction in which the bending portion B is extended. The second overlying wires 4e are electrically connected respectively to the underlying wires 7b via a plurality of second contact holes Hb formed through the stack of the second resin layer 8, the base coat film 11, and the gate insulation film 13, as shown in FIGS. 6 and 7. The second overlying wires 14e reach the terminal section T as shown in FIGS. 1 and 8 and in the terminal section T, are electrically connected respectively to terminal electrodes 18t via a plurality of third contact holes Hc formed through the stack of the first interlayer insulation film 15 and the second interlayer insulation film 17. The terminal electrodes 18t are made of the same material and in the same layer as the source lines 18f and exposed in the middle parts thereof out of the planarization film 19 as shown in FIG. 8.

The planarization film 19 has a flat surface at least in the display area D. The planarization film 19 is provided so as to cover the slit S formed through the stack of the base coat film 11, the gate insulation film 13, the first interlayer insulation film 15, and the second interlayer insulation film 17 as shown in FIG. 7 and made of, for example, an organic resin material such as a polyimide resin.

The OLEDs 40 are provided in the display area D and include the first electrodes 31, an edge cover 32, the organic light-emitting layers 33, the second electrode 34, and a sealing film 38 that are provided sequentially on the planarization film 19 as shown in FIG. 3.

The first electrodes 31 are associated with the respective subpixels P and arranged in a matrix as pixel electrodes on the planarization film 19 as shown in FIG. 3. Each first electrode 31 is connected to the drain electrode 18*d* of the second TFT 9*b* via a contact hole formed through the planarization film 19 as shown in FIG. 3. The first electrodes 31 have a function of injecting holes to the organic light-emitting layers 33. The first electrodes 31 are more preferably made of a material that has a large work function in order to improve the efficiency of hole injection to the organic light-emitting layers 33. The first electrodes 31 are made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). The first electrodes 31 may alternatively be made of, for example, an alloy such as an astatine-astatine oxide (At—$AtO_2$). As another alternative, the first electrodes 31 may be made of, for example, an electrically conductive oxide such as tin oxide (SnO), zinc oxide (ZnO), indium tin oxide (ITO), or indium zinc oxide (IZO). As a further alternative, the first electrodes 31 may be a stack of layers of any of these materials. Examples of compound materials that have a large work function include indium tin oxide (ITO) and indium zinc oxide (IZO).

The edge cover 32 is arranged to form a lattice covering the peripheral portions of the first electrodes 31 as shown in FIG. 3. The edge cover 32 may be made of an organic film of, for example, polyimide resin, acrylic resin, polysiloxane resin, or novolac resin.

The organic light-emitting layers 33, one for each subpixel P, are arranged in a matrix on the first electrodes 31 as shown in FIG. 3. Each organic light-emitting layer 33 includes a hole injection layer 1, a hole transport layer 2, a light-emitting layer 3, an electron transport layer 4, and an electron injection layer 5 that are provided sequentially on the first electrodes 31 as shown in FIG. 5.

The hole injection layer 1, alternatively referred to as the anode buffer layer, has a function of bringing the energy levels of the first electrode 31 and the organic light-emitting layer 33 closer to each other to improve the efficiency of hole injection from the first electrode 31 to the organic light-emitting layer 33. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styrylanthracene derivative, a fluorenone derivative, a hydrazone derivative, or a stilbene derivative.

The hole transport layer 2 has a function of improving the efficiency of hole transport from the first electrode 31 to the organic light-emitting layer 33. The hole transport layer 2 is made of, for example, a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyaryl alkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is injected with holes and electrons from the first electrode 31 and the second electrode 34 respectively when the light-emitting layer 3 is under the voltage applied by the first electrode 31 and the second electrode 34. These injected holes and electrons recombine in the light-emitting layer 3. The light-emitting layer 3 is made of a material that has a high light-emitting efficiency. The light-emitting layer 3 is made of, for example, a metal oxynoid compound (8-hydroxy quinoline metal complex), a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bis(styryl)benzene derivative, a tris(styryl)benzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, or polysilane.

The electron transport layer 4 has a function of efficiently transporting electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxynoid compound.

The electron injection layer 5 has a function of bringing the energy levels of the second electrode 34 and the organic light-emitting layer 33 closer to each other to improve the efficiency of electron injection from the second electrode 34 to the organic light-emitting layer 33. This function can lower the drive voltage of the OLED 40. The electron injection layer 5 is alternatively referred to as the cathode buffer layer. The electron injection layer 5 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 34 serves as a common electrode so as to cover the organic light-emitting layer 33 and the edge cover 32 as shown in FIG. 3. The second electrode 34 has a function of injecting electrons to the organic light-emitting layer 33. The second electrode 34 is more preferably made of a material that has a small work function in order to improve the efficiency of electron injection to the organic light-emitting layer 33. The second electrode 34 is made of, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). The second electrode 34 may alternatively be made of, for example, a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrode 34 may be made of, for example, an electrically conductive oxide such as tin oxide (SnO), zinc oxide (ZnO), indium tin oxide (ITO), or indium zinc oxide (IZO). As a further alternative, the second electrode 34 may be a stack of layers of any of these materials. Examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

The sealing film 38 includes: a first inorganic film 35 provided so as to cover the second electrodes 34; an organic film 36 on the first inorganic film 35; and a second inorganic film 37 provided so as to cover the organic film 36, as shown in FIG. 3. The sealing film 38 has a function of protecting the organic light-emitting layers 33 from, for example, water and oxygen. The first inorganic film 35 and the second inorganic film 37 are made of, for example, an inorganic material such as silicon oxide ($SiO_2$), aluminum oxide ($A_2O_3$), silicon nitride (SiNx, where x is a positive number) (e.g., trisilicon tetranitride ($Si_3N_4$)), or silicon carbide nitride (SiCN). The organic film 36 is made of, for example, an organic material such as acrylic resin, polyurea resin, parylene resin, polyimide resin, or polyamide resin.

The OLED display device 50a described above is arranged, in each subpixel P, to turn on the first TFT 9a by inputting a gate signal to the first TFT 9a via the gate line 14 and to apply a prescribed voltage corresponding to a source signal to the gate electrode 14b and the capacitor 9c of the second TFT 9b via the source line 18f, to specify the magnitude of the current from the power supply line 18g on the basis of the gate voltage of the second TFT 9b, so that the specified current is fed to the organic light-emitting layer 33, thereby causing the light-emitting layer 3 in the organic light-emitting layer 33 to emit light to display an image. In the OLED display device 50a, the gate voltage of the second TFT 9b is retained by the capacitor 9c when the first TFT 9a is turned off. The light-emitting layer 3 therefore continuously emits light until a gate signal is inputted in the next frame.

Next will be described a method of manufacturing the OLED display device 50a in accordance with the present embodiment. The method of manufacturing the OLED display device 50a in accordance with the present embodiment includes a resin substrate layer forming step, a TFT layer forming step, and an OLED forming step.

Resin Substrate Layer Forming Step

First, for example, a resin material such as a polyimide resin is applied onto a glass substrate using a slit coater and then cured. Thereafter, one of the surfaces of the cured resin material is subjected to ashing by plasma to form the first resin layer 6 with a thickness of approximately 5 µm to 10 µm.

Subsequently, a metal film such as a molybdenum film is formed on the ashed surface of the first resin layer 6 by, for example, sputtering. The metal film is then subjected to patterning to form the underlying conductive layer 7a and the underlying wires 7b with a thickness of approximately 250 nm to 300 nm.

For example, a resin material such as polyimide resin is applied onto the surface of the first resin layer 6 where the underlying conductive layer 7a and the underlying wires 7b have been formed, using, for example, a slit coater. The applied resin material is then cured to form the second resin layer 8 with a thickness of approximately 5 µm to 10 µm and to form the resin substrate layer 10a.

TFT Layer Forming Step

For instance, the base coat film 11, the first TFTs 9a, the second TFTs 9b, the capacitors 9c, and the planarization film 19 are formed by a well-known method on the surface of the second resin layer 8 in the resin substrate layer 10a formed in the preceding resin substrate layer forming step, to form the TFT layer 20a.

The first contact holes Ha and the second contact holes Hb are formed through a stack of the second resin layer 8, the base coat film 11, and the gate insulation film 13 before forming, for example, the gate lines 14 in the formation of the first TFTs 9a and the second TFTs 9b. Thereafter, in the formation of, for example, the gate lines 14, the first overlying wires 14d and the second overlying wires 14e are formed. The slit S is formed through the stack of the base coat film 11, the gate insulation film 13, the first interlayer insulation film 15, and the second interlayer insulation film 17 in the bending portion B in the frame area F, and the third contact holes Hc are formed through the stack of the first interlayer insulation film 15 and the second interlayer insulation film 17 in the terminal section T, before the formation of, for example, the source lines 18f. Thereafter, the terminal electrodes 18t are formed in the formation of, for example, the source lines 18f.

OLED Forming Step

First, the first electrodes 31, the edge cover 32, the organic light-emitting layers 33 (the hole injection layer 1, the hole transport layer 2, the light-emitting layer 3, the electron transport layer 4, and the electron injection layer 5), and the second electrode 34 are formed by a well-known method on the planarization film 19 on the TFT layer 20a formed in the TFT layer forming step.

Subsequently, the first inorganic film 35 is formed on the surface of the substrate where the second electrodes 34 have been formed, by forming an inorganic insulation film such as a silicon nitride film, a silicon oxide film, or a silicon oxynitride film by plasma CVD (chemical vapor deposition) using a mask.

Thereafter, the organic film 36 is formed by forming a film of, for example, an organic resin material such as acrylic resin on the surface of the substrate where the first inorganic film 35 has been formed, by, for example, inkjet technology.

Furthermore, the second inorganic film 37 is formed by forming, for example, an inorganic insulation film such as a silicon nitride film, a silicon oxide film, or a silicon oxynitride film on the substrate where the organic film 36 has been formed, by plasma CVD using a mask. The sealing film 38, including the first inorganic film 35, the organic film 36, and the second inorganic film 37, is formed in this manner, to form the OLEDs 40.

Finally, a protective sheet (not shown) is attached to the surface of the substrate on which the OLEDs 40 have been formed. Thereafter, a laser beam is projected onto the glass substrate side of the resin substrate layer 10a, to detach a glass substrate from the bottom face of the first resin layer 6 in the resin substrate layer 10a. A protective sheet (not shown) is then attached to the bottom face of the first resin layer 6 from which the glass substrate has been detached.

The OLED display device 50a in accordance with the present embodiment can be manufactured by these steps.

Figure 9:
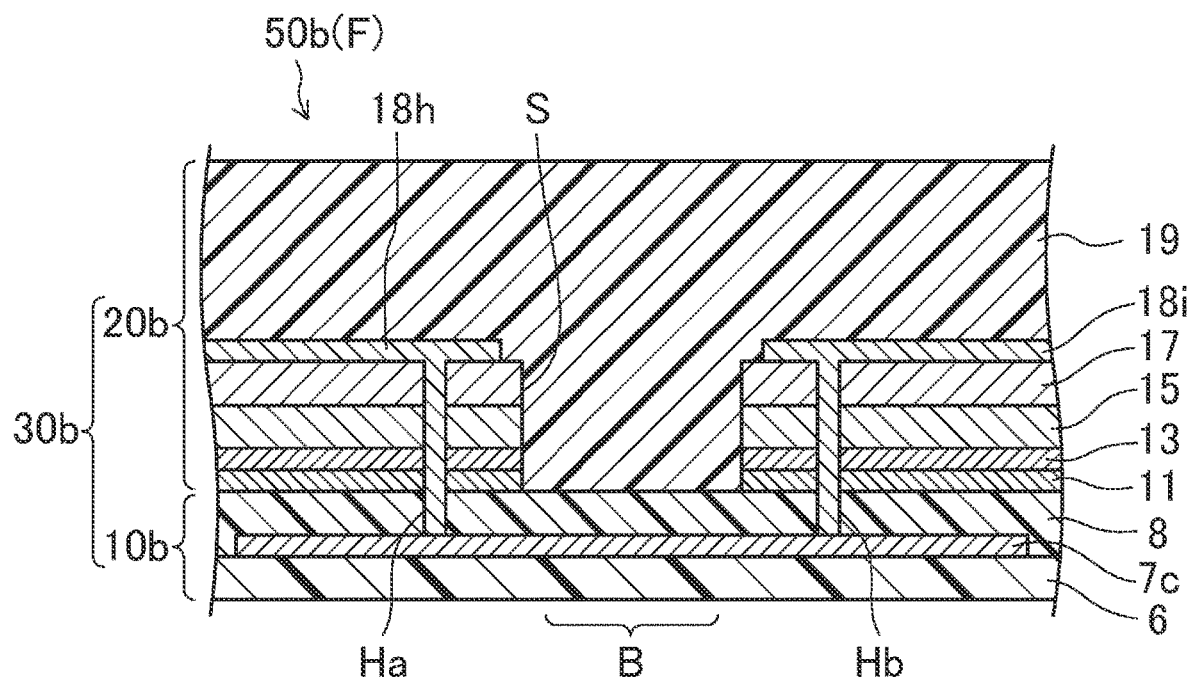
FIG. 9 is a cross-sectional view of a bending portion in a frame area of a variation example of the OLED display device in accordance with the first embodiment of the disclosure.

The present embodiment has discussed the OLED display device 50a in which the first overlying wires 14d and the second overlying wires 4e are formed of a gate metal film. Alternatively, the present embodiment may be applied to an OLED display device 50b in which first overlying wires 18h and second overlying wires 18i are formed of a source metal film, as shown in FIG. 9. FIG. 9 is a cross-sectional view of the bending portion B in the frame area F of the OLED display device 50b which is a variation example of the OLED display device 50a.

Specifically, the OLED display device 50b includes an active matrix substrate 30b (see FIG. 9) and the OLEDs 40 on the active matrix substrate 30b.

The active matrix substrate 30b includes: a resin substrate layer 10b as a resin substrate; and a TFT layer 20b on the resin substrate layer 10b as shown in FIG. 9.

The resin substrate layer 10b includes: the first resin layer 6 in the display area D and the frame area F opposite the TFT layer 20b; the second resin layer 8 on the TFT layer 20b side of the first resin layer 6 in the display area D and the frame area F; and the underlying conductive layer 7a (see FIG. 3) and a plurality of underlying wires 7c between the first resin layer 6 and the second resin layer 8, as shown in FIG. 9.

On the TFT layer 20b side of the first resin layer 6 in the frame area F, the underlying wires 7c run parallel to each other in a direction perpendicular to the direction in which the bending portion B is extended. The underlying conductive layer 7a and the underlying wires 7c are made of the same material as the source lines 18f (e.g., a stack of metal films such as titanium, aluminum, and titanium films).

The TFT layer 20b is essentially the same as the TFT layer 20a, except that the first overlying wires 18h and the second overlying wires 18i, which correspond to the first overlying wires 14d and the second overlying wires 14e respectively, are formed of a source metal film instead of a gate metal film.

In the OLED display device 50b, the first overlying wires 18h between the second interlayer insulation film 17 and the planarization film 19 are electrically connected respectively to the underlying wires 7c via the first contact holes Ha formed through the stack of the second resin layer 8, the base coat film 11, the gate insulation film 13, the first interlayer insulation film 15, and the second interlayer insulation film 17, as shown in FIG. 9. Also in the OLED display device 50b, the second overlying wires 18i between the second interlayer insulation film 17 and the planarization film 19 are electrically connected respectively to the underlying wires 7c via the second contact holes Hb formed through the stack of the second resin layer 8, the base coat film 11, the gate insulation film 13, the first interlayer insulation film 15, and the second interlayer insulation film 17 as shown in FIG. 9. The present variation example has discussed, as an example, the first overlying wires 18h and the second overlying wires 18i being formed of a source metal film. Alternatively, the first overlying wires and the second overlying wires may be made of the same material and in the same layer as the upper conductive layer 16 provided between the first interlayer insulation film 15 and the second interlayer insulation film 17.

As described so far, in the OLED display device 50a in accordance with the present embodiment, between the display area D and the bending portion B, the first overlying wires 14d run parallel to each other in a direction perpendicular to the direction in which the bending portion B is extended. In addition, between the bending portion B and the terminal section T, the second overlying wires 14e run parallel to each other in a direction perpendicular to the direction in which the bending portion B is extended. In the frame area F, the underlying wires 7b run parallel to each other in a direction perpendicular to the direction in which the bending portion B is extended and traverse the slit S formed through the base coat film 11, the gate insulation film 13, the first interlayer insulation film 15, and the second interlayer insulation film 17. The first overlying wires 14d and the second overlying wires 14e are electrically connected respectively to the underlying wires 7b via the first contact holes Ha and the second contact holes Hb formed through the stack of the second resin layer 8, the base coat film 11, and the gate insulation film 13. In the bending portion B, the underlying wires 7b, residing across the slit S, are provided between the first resin layer 6 and the second resin layer 8 with no intervening inorganic insulation film that easily develops cracks when bent. The underlying wires 7b are hence less likely to break when the OLED display device 50a is bent in the bending portion B. Furthermore, no planarization films with a flat surface, other than the planarization film 19, are provided inside the slit S at least in the display area D. The underlying wires 7b are hence less likely to break without the bending portion B having to include a separate planarization film in the frame area F.

Additionally, in the OLED display device 50a in accordance with the present embodiment, the first overlying wires 14d and the second overlying wires 14e are made of the same material and in the same layer as the gate lines 14, and the underlying wires 7b are made of the same material as the gate lines 14. It is therefore easy to match the electrical resistances of the first overlying wires 14d, the second overlying wires 14e, and the underlying wires 7b.

In the OLED display device 50a in accordance with the present embodiment, the surface on the second resin layer 8 side of the first resin layer 6 is irregular, and the underlying conductive layer 7a and the underlying wires 7b are provided on this irregular surface. This structure improves adherence of the first resin layer 6 to the underlying conductive layer 7a and the underlying wires 7b.

In the OLED display device 50a in accordance with the present embodiment, the underlying conductive layer 7a is provided so as to overlap the entire display area D between the first resin layer 6 and the second resin layer 8. This structure can block, for example, water from moving from the first resin layer 6 to the second resin layer 8, thereby restraining degradation of the organic light-emitting layers 33 in the OLEDs 40.

Furthermore, in the OLED display device 50a in accordance with the present embodiment, the underlying conductive layer 7a, residing between the first resin layer 6 and the second resin layer 8, is electrically connected to the low-voltage supply line Wa or the high-voltage supply line Wb. It is therefore possible to reduce the electrical resistance of the voltage supply lines.

Second Embodiment

Figure 10:
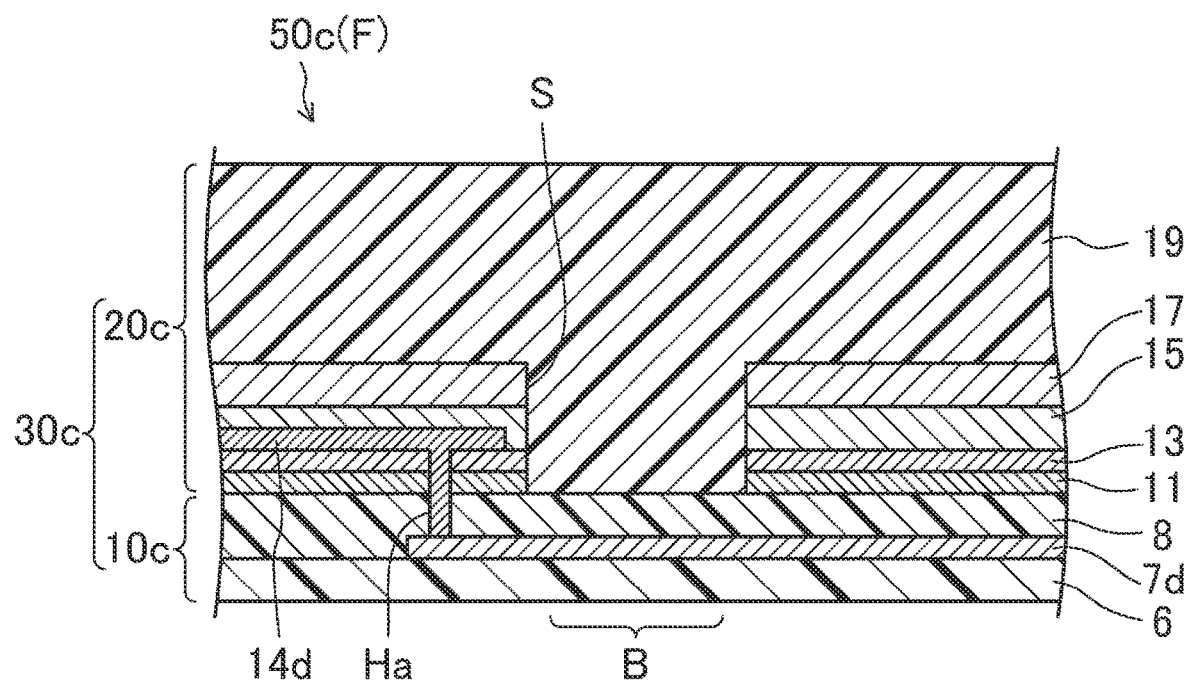
FIG. 10 is a cross-sectional view of a bending portion in a frame area of an OLED display device in accordance with a second embodiment of the disclosure.
Figure 11:
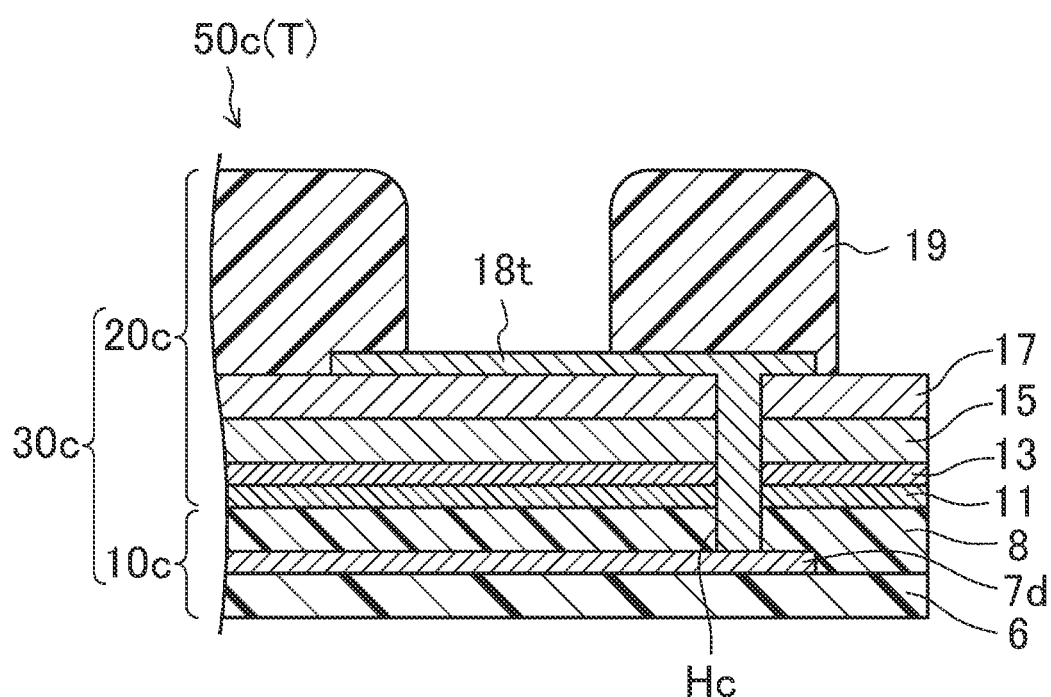
FIG. 11 is a cross-sectional view of a terminal section in the frame area of the OLED display device in accordance with the second embodiment of the disclosure.

FIGS. 10 and 11 show a second embodiment of the display device in accordance with the disclosure. FIG. 10 is a cross-sectional view of a bending portion B in a frame area F of an OLED display device 50c in accordance with the present embodiment. FIG. 11 is a cross-sectional view of a terminal section T in the frame area F of the OLED display device 50c. Members of this and subsequent embodiments that are the same as those shown in FIGS. 1 to 9 are indicated by the same reference signs or numerals, and detailed description thereof will not be repeated.

The first embodiment described above has discussed, as an example, the OLED display device 50a including the first overlying wires 14d and the second overlying wires 14e. The present embodiment will discuss, as an example, the OLED display device 50c including no second overlying wires 14e.

The OLED display device 50c includes an active matrix substrate 30c (see FIGS. 10 and 11) and OLEDs 40 on the active matrix substrate 30c.

The active matrix substrate 30c includes: a resin substrate layer 10c as a resin substrate; and a TFT layer 20c on the resin substrate layer 10c, as shown in FIGS. 10 and 11.

The resin substrate layer 10c, as shown in FIGS. 10 and 11, includes: a first resin layer 6 in the display area D and the frame area F opposite the TFT layer 20c; a second resin layer 8 on the TFT layer 20c side of the first resin layer 6 in the display area D and the frame area F; and an underlying conductive layer 7a (see FIG. 3) and a plurality of underlying wires 7d between the first resin layer 6 and the second resin layer 8.

The underlying wires 7d, on the TFT layer 20b side of the first resin layer 6 in the frame area F, run parallel to each other in a direction perpendicular to the direction in which the bending portion B is extended. The underlying conductive layer 7a and the underlying wires 7d are made of the same material as the source lines 18f (e.g., a stack of metal films such as titanium, aluminum, and titanium films). The underlying wires 7d reach the terminal section T as shown in FIG. 11 and in the terminal section T, are electrically connected respectively to the terminal electrodes 18t via a plurality of third contact holes He formed through a stack of the second resin layer 8, the base coat film 11, the gate insulation film 13, the first interlayer insulation film 15, and the second interlayer insulation film 17.

The TFT layer 20c is essentially the same as the TFT layer 20a in accordance with the first embodiment, except that the former includes no second overlying wires 14e (see FIG. 7) between the bending portion B and the terminal section T as shown in FIG. 10 and also that the underlying wires 7d are electrically connected respectively to the terminal electrodes 18t as described above.

The OLED display device 50c is flexible similarly to the OLED display device 50a in accordance with the first embodiment and is arranged in each subpixel P to cause a light-emitting layer 3 in an organic light-emitting layer 33 via a first TFT 9a and a second TFT 9b to emit light in a suitable manner, to display an image.

The OLED display device 50c in accordance with the present embodiment can be manufactured by the same method as the method of manufacturing the OLED display device 50a described in the first embodiment, except that the pattern for the underlying wires 7b is changed, no second overlying wires 14e and no second contact holes Hb are provided, and the third contact holes He are changed in depth.

As described so far, in the OLED display device 50c in accordance with the present embodiment, between the display area D and the bending portion B, the first overlying wires 14d run parallel to each other in a direction perpendicular to the direction in which the bending portion B is extended. In addition, in the frame area F, the underlying wires 7d run parallel to each other in a direction perpendicular to the direction in which the bending portion B is extended and traverse the slit S formed through the base coat film 11, the gate insulation film 13, the first interlayer insulation film 15, and the second interlayer insulation film 17. The first overlying wires 14d are electrically connected respectively to the underlying wires 7d via the first contact holes Ha formed through the stack of the second resin layer 8, the base coat film 11, and the gate insulation film 13. In the bending portion B, the underlying wires 7d, residing across the slit S, are provided between the first resin layer 6 and the second resin layer 8 with no intervening inorganic insulation film that easily develops cracks when bent. The underlying wires 7d are hence less likely to break when the OLED display device 50a is bent in the bending portion B. Furthermore, no planarization films with a flat surface, other than the planarization film 19, are provided inside the slit S at least in the display area D. The underlying wires 7d are hence less likely to break without the bending portion B having to include a separate planarization film in the frame area F.

Additionally, in the OLED display device 50c in accordance with the present embodiments, the terminal electrodes 18t are made of the same material and in the same layer as the source lines 18f, and the underlying wires 7d are made of the same material as the source lines 18f. It is therefore possible to reduce the electrical resistance of the underlying wires 7d.

In the OLED display device 50c in accordance with the present embodiment, the surface on the second resin layer 8 side of the first resin layer 6 is irregular, and the underlying conductive layer 7a and the underlying wires 7d are provided on this irregular surface. This structure improves adherence of the first resin layer 6 to the underlying conductive layer 7a and the underlying wires 7d.

In the OLED display device 50c in accordance with the present embodiment, the underlying conductive layer 7a is provided so as to overlap the entire display area D between the first resin layer 6 and the second resin layer 8. This structure can block, for example, water from moving from the first resin layer 6 to the second resin layer 8, thereby restraining degradation of the organic light-emitting layers 33 in the OLEDs 40.

Furthermore, in the OLED display device 50c in accordance with the present embodiment, the underlying conductive layer 7a, residing between the first resin layer 6 and the second resin layer 8, is electrically connected to the low-voltage supply line Wa or the high-voltage supply line Wb. It is therefore possible to reduce the electrical resistance of the voltage supply lines.

OTHER EMBODIMENTS

The embodiments have so far discussed examples where the organic light-emitting layer has a 5-layer structure that includes a hole injection layer, a hole transport layer, a light-emitting layer, an electron transport layer, and an electron injection layer. Alternatively, the organic light-emitting layer may have, for example, a 3-layer structure that includes a hole injection and transport layer, a light-emitting layer, and an electron transport and injection layer.

The embodiments have so far discussed examples where the OLED display device includes the first electrodes serving as anodes and the second electrodes serving as cathodes. The disclosure is also applicable to an OLED display device in which the layer structure of the organic light-emitting layer is reversed so that the first electrodes serve as cathodes and the second electrodes serve as anodes.

The embodiments have so far discussed an exemplary OLED display device where the electrode of the TFT connected to the first electrode serves as a drain electrode. The disclosure is also applicable to an OLED display device where the electrode of the TFT connected to the first electrode serves as a source electrode.

The embodiments have so far discussed the OLED display device as an exemplary display device. The disclosure is applicable to any display device including a plurality of current-driven light-emitting elements, for instance, applicable to a display device including QLEDs (quantum-dot light-emitting diodes) which are light-emitting elements including a quantum dot layer.

INDUSTRIAL APPLICABILITY

As described above, the disclosure is useful in flexible display devices.

The invention claimed is:

1. A display device comprising:
a resin substrate on which a display area where an image is displayed and a frame area surrounding the display area are specified;
a thin film transistor (TFT) layer on the resin substrate;
a terminal section along a side of the frame area;
a bending portion extending in a first direction between the display area and the terminal section;
a stack of inorganic insulation films on the resin substrate, the inorganic insulation films partially forming the TFT layer and having a slit formed therethrough in the bending portion to expose a top face of the resin substrate; and
a plurality of first overlying wires on any one of the inorganic insulation films, the plurality of first overlying wires, partially forming the TFT layer and between the display area and the bending portion, extending parallel to each other in a second direction crossing the first direction, wherein
the resin substrate includes:
a first resin layer in the display area and the frame area opposite the TFT layer;
a plurality of underlying wires on a TFT layer side of the first resin layer in the frame area, the plurality of underlying wires extending across the slit and parallel to each other in the second direction; and
a second resin layer on the TFT layer side of the first resin layer in the display area and the frame area, the second resin layer covering the plurality of underlying wires, and
the plurality of first overlying wires is electrically connected, respectively, to the plurality of underlying wires via a plurality of first contact holes, formed through the second resin layer and the inorganic insulation films, residing between the plurality of first overlying wires and the plurality of underlying wires.

2. The display device according to claim 1, the display device further comprising a plurality of second overlying wires on any one of the inorganic insulation films, the plurality of second overlying wires, partially forming the TFT layer and between the bending portion and the terminal section, extending parallel to each other in the second direction, wherein
the plurality of second overlying wires is electrically connected, respectively, to the plurality of underlying wires via a plurality of second contact holes, formed through the second resin layer and the inorganic insulation films, residing between the plurality of second overlying wires and the plurality of underlying wires.

3. The display device according to claim 2, wherein the plurality of first overlying wires and the plurality of second overlying wires are made of a same material and in a same layer.

4. The display device according to claim 1, wherein
the terminal section includes a plurality of terminal electrodes, each of the plurality of terminal electrodes corresponding to one of the plurality of underlying wires, and
the plurality of terminal electrodes connected respectively, to the plurality of underlying wires via a plurality of third contact holes, formed through the second resin layer and the inorganic insulation films, residing between the plurality of terminal electrodes and the plurality of underlying wires.

5. The display device according to claim 4, wherein
the TFT layer includes:
a gate insulation film, a first interlayer insulation film, and a second interlayer insulation film provided sequentially as the inorganic insulation films; and
a planarization film on the second interlayer insulation film,
the display device further comprising a plurality of source lines between the second interlayer insulation film and the planarization film in the display area, the plurality of source lines extending parallel to each other, wherein
the plurality of terminal electrodes is made of a same material and in a same layer as the plurality of source lines, and
the plurality of underlying wires is made of a same material as the plurality of source lines.

6. The display device according to claim 1, wherein
the TFT layer includes:
a gate insulation film, a first interlayer insulation film, and a second interlayer insulation film provided sequentially as the inorganic insulation films; and
a planarization film on the second interlayer insulation film,
the display device further comprising:
a plurality of gate lines between the gate insulation film and the first interlayer insulation film in the display area, the plurality of gate lines extending parallel to each other; and
a plurality of source lines between the second interlayer insulation film and the planarization film in the display area, the plurality of source lines crossing the plurality of gate lines and extending parallel to each other.

7. The display device according to claim 6, wherein the plurality of first overlying wires is made of a same material and in a same layer as the plurality of gate lines.

8. The display device according to claim 7, wherein the plurality of underlying wires is made of a same material the plurality of gate lines.

9. The display device according to claim 6, wherein the plurality of first overlying wires is made of a same material and in a same layer as the plurality of source lines.

10. The display device according to claim 9, wherein the plurality of underlying wires is made of a same material as the plurality of source lines.

11. The display device according to claim 1, wherein
the first resin layer has an irregular surface on a second resin layer side thereof, and
the plurality of underlying wires resides on the irregular surface.

12. The display device according to claim 1, further comprising an underlying conductive layer between the first resin layer and the second resin layer, wherein the underlying conductive layer is made of a same material and in a same layer as the plurality of underlying wires and overlaps an entire display area.

13. The display device according to claim 12, further comprising a voltage supply line in the frame area, the voltage supply line surrounding the display area, wherein the underlying conductive layer is electrically connected to the voltage supply line in the frame area.

14. The display device according to claim 13, further comprising light-emitting elements on the TFT layer, the light-emitting elements forming the display area, wherein the light-emitting elements are organic light-emitting diodes.

15. The display device according to claim 1, wherein the slit extends in a direction parallel to the first direction.

* * * * *